United States Patent [19]

Sukegawa et al.

[11] Patent Number: 5,596,537
[45] Date of Patent: Jan. 21, 1997

[54] SEMICONDUCTOR DEVICE TEST CIRCUIT HAVING TEST ENABLE CIRCUITRY AND TEST MODE-ENTRY CIRCUITRY

[75] Inventors: Shunichi Sukegawa; Shiyuzo Shiozaki, both of Tsukuba; Hiromi Matsuura, Tokorozawa; Masaya Muranaka, Akishima, all of Japan

[73] Assignees: Texas Instruments Incorporated, Dallas, Tex.; Hitachi Ltd., Tokyo, Japan

[21] Appl. No.: 275,700

[22] Filed: Jul. 14, 1994

[30] Foreign Application Priority Data

Jul. 14, 1993 [JP] Japan ................................. 5-196823

[51] Int. Cl.$^6$ ....................................................... G11C 7/00
[52] U.S. Cl. ................. 365/201; 365/230.06; 365/230.08
[58] Field of Search .............................. 365/201, 230.06, 365/230.08; 371/21.1

[56] References Cited

U.S. PATENT DOCUMENTS 5,337,282 8/1994 Koike ......................................... 365/222

*Primary Examiner*—David C. Nelms
*Assistant Examiner*—Andrew Q. Tran
*Attorney, Agent, or Firm*—William E. Hiller; Richard L. Donaldson

[57] ABSTRACT

A semiconductor device test circuit for inclusion on a semiconductor chip having a semiconductor device thereon, wherein a test mode with respect to the semiconductor device is not entered during normal use of the semiconductor device and the test mode can be entered without applying a voltage higher than the power supply voltage to an external terminal of the semiconductor device. The test circuit includes a decoder circuit which detects the matching of a first address input corresponding to a test mode, and a latch circuit which latches the signal indicating the matching of the first address input with a test mode. A second decoder circuit then detects the matching of a second address to the test mode, the second address being input when the matching signal for the first address has been latched. A second latch circuit latches the signal indicating the matching of the second address. A third address input is processed by a third decoder circuit and a third latch circuit in the same way. This means that when a plurality of addresses (three addresses in the described example) which are consecutively input to the respective decoder circuits are in a predetermined, specific combination, a test enable signal is output and the test mode is activated.

7 Claims, 7 Drawing Sheets

| OPERATION | | | TEST MODE |
|---|---|---|---|
| WCBR+ADDRESS | 01000 | (A) | TEST MODE ENABLE CYCLE |
| WCBR+ADDRESS | 01101 | (B) | |
| WCBR+ADDRESS | 10010 | (C) | |
| WCBR+ADDRESS | 00011 | (D) | 32 BIT PARALLEL TEST |
| TEST CYCLE (NORMAL READ WRITE/CYCLE) | | | |
| WCBR+ADDRESS | 01001 | (E) | DOUBLE WORD SMALL Cs CHECK |
| TEST CYCLE (NORMAL READ WRITE/CYCLE) | | | |
| WCBR+ADDRESS | 10000 | (F) | REDUNDANCY AREA TEST X |
| TEST CYCLE (NORMAL READ WRITE/CYCLE) | | | |
| WCBR+ADDRESS | 10001 | (G) | REDUNDANCY AREA TEST X +REDUNDANCY AREA TEST Y |
| TEST CYCLE (NORMAL READ WRITE/CYCLE) | | | DOUBLE WORD SMALL Cs CHECK +REDUNDANCY AREA TEST X +REDUNDANCY AREA TEST Y |
| WCBR+ADDRESS | 01001 | (H) | |
| TEST CYCLE (NORMAL READ WRITE/CYCLE) | | | WORD LINE LEAK CHECK +REDUNDANCY AREA TEST X +REDUNDANCY AREA TEST Y |
| WCBR+ADDRESS | 01000 | (I) | |
| TEST CYCLE (NORMAL READ WRITE/CYCLE) | | | ROW COPY (BL-Vdd) +REDUNDANCY AREA TEST X +REDUNDANCY AREA TEST Y |
| WCBR+ADDRESS | 00110 | (J) | |
| TEST CYCLE (NORMAL READ WRITE/CYCLE) | | | |
| TEST MODE EXIT CYCLE (RAS ONLY CTC.) | | (K) | NORMAL MODE |

SEMICONDUCTOR DEVICE TEST CIRCUIT HAVING TEST ENABLE CIRCUITRY AND TEST MODE-ENTRY CIRCUITRY

The present invention relates to a test circuit included in a semiconductor device, and particularly to a test circuit for initiating the execution of a testing procedure with respect to a semiconductor device to determine whether the semiconductor is operating in an appropriate manner.

BACKGROUND OF THE INVENTION

In a semiconductor device, a test circuit for testing the function of the internal circuitry of that device is typically included. This test of the internal circuitry in a semiconductor device is to be executed before the shipping of the semiconductor device, and it is not intended to be conducted by a user of the semiconductor device. Consequently, various means are provided in the test circuit of the semiconductor device to prevent the inadvertent activation of the testing operation by the user.

A conventional testing method for a semiconductor device, such as a dynamic random access memory (DRAM), for example, involves the activation of a test circuit of the DRAM, that is, entry into a test mode, which is effected by the input of the address signal indicating the test mode in WCBR cycle. In this case, in order to prevent an erroneous entry into the test mode, the test mode is established such that it is entered only when a voltage higher than a specified power supply voltage is applied to an external terminal of the DRAM. Because a voltage higher than the power supply voltage is not applied to the external terminal of the DRAM during the normal use of the DRAM, the test mode is not entered erroneously during normal use.

The aforementioned WCBR means the operation in which the write enable signal WE and column address strobe signal CAS become low in level prior to the row-address strobe signal RAS.

In the conventional DRAM test, for each test, the address indicating the intended test mode is defined, and the intended test is executed when the address indicating a specified test is input. In other words, the test mode and the address codes indicating the applicable test mode have a 1 to 1 correspondence, and the test circuit corresponding to each test mode is individually provided inside the DRAM.

For the word line stress test, the address indicating its test is defined, and also, for the disturb test, the address indicating its test is defined. Thus, the test circuits for executing the word line stress test and the disturb test are provided individually.

FIG. 8 shows a conventional test mode entry circuit of a DRAM. A decoder circuit 81 provides a test mode signal as an output indicating the detection of an address signal indicative of a specified test as input thereto. The test mode signal is the signal indicating the entry of the test mode.

In this conventional test mode entry circuit, because the decoder output for the address indicating the test mode is used as is as the test mode signal, when a different address is input in the next WCBR cycle, only the test mode signal of the test mode entry circuit corresponding to that address becomes active, while the other test mode signals become nonactive. Therefore, it is impossible to enter a number of tests at the same time.

FIG. 9 shows the details of the circuits of the decoder circuit 81 of the test mode entry circuit shown in FIG. 8. The decoder circuit 81 comprises two NAND circuits, NAND 91, 92, a NOR circuit, NOR 91, and inverters, IN 91, 92. This circuit is set to output, during a WCBR cycle, a high level signal when the values of the lower 5 bits of the address signal are 0, 1, 1, 0, 0, that is, when they are 0Bh in hexadecimal notation. In FIG. 9, A2 and A3 are the logic signals of the respective bits to which the address signals correspond, and A4B, A1B, A0B are the inverted signals of respective bits to which the address signals correspond.

The entry into the test mode as conventionally employed involves the application of a voltage higher than the supply voltage to a specific terminal of the semiconductor device undergoing testing. Deterioration of a transistor of the semiconductor device that is caused by the application of such high voltage is a problem. Also, during burn-in testing, a type of semiconductor device test procedure, a voltage higher than the supply voltage is applied to each terminal of the semiconductor device. If the test mode for the internal circuitry is entered erroneously during burn-in testing, an incorrect testing operation results.

Furthermore, in the conventional test circuit, the test mode and the address code indicating the test mode are to correspond 1 to 1, and the test circuit corresponding to each test mode is provided individually inside the semiconductor device. Accordingly, with the increase in the number of types of test modes, the area of the semiconductor chip occupied by the test circuit increases to an undesirable degree.

In addition, in the conventional test mode entry circuit, it is impossible to enter a number of tests at the same time, and each test is executed individually. Therefore, the number of test modes increases, making it necessary to increase the area of the semiconductor chip occupied by the test circuit.

It is therefore an object of the present invention to provide a semiconductor device test circuit, in which the test mode is not entered during normal use, and also the test mode can be entered without applying a voltage higher than the power supply voltage to an external terminal of the semiconductor device undergoing testing.

It is another object of the present invention to provide a semiconductor device test circuit, in which the percentage of the area of the semiconductor device occupied by the test circuit is reduced through decreasing the number of address codes by which the tests are defined.

Still another object of the present invention is to provide a semiconductor device test circuit, which is capable of curbing an increase in the area of the semiconductor chip occupied by the test circuit, by accommodating an increasing number of types of tests.

Yet another object of the present invention is to provide a semiconductor device test circuit, wherein a number of test modes can be entered simultaneously.

SUMMARY OF THE INVENTION

A semiconductor device test circuit in accordance with the present invention is provided with a test enable signal generating circuit to detect the consecutive inputs of a number of addresses in a given operating cycle, and to output the test enable signal when the number of addresses are in a predetermined, specific combination.

Furthermore, the test circuit of the present invention may include a number of test mode entry circuits each including a decoder to output the address matching signal by detecting the address corresponding to the test contents, and a latch circuit to output the test mode signal for directing the execution of the test by latching the address matching signal in response to the test enable signal; and to perform the test of the internal circuitry through combining and activating the number of test mode entry circuits.

The semiconductor device test circuit according to the present invention has a test enable signal generating circuit to output the test enable signal when a predetermined, specific combination of addresses is input during a specific operating cycle. This test enable signal generating circuit outputs the test enable signal when a number of addresses which are input consecutively are combined in a predetermined defined combination, during a specific operating cycle. This means that since the test mode is defined by the combination of the addresses which are input, it is not necessary to apply a voltage higher than the power supply voltage to an external terminal of the semiconductor device undergoing testing.

Moreover, the test circuit according to the present invention is provided with a number of test mode entry circuits, and it is possible to execute various tests by combining the multiple test mode entry circuits and activating them. By dividing the plurality of respective test functions which conventionally have been assigned to each of a plurality of respective test circuits into a number of smaller functions and assigning them to the test mode entry circuits, various tests can be executed by combining the smaller (subdivided) functions. As to the common areas, the test circuits for those portions can be reduced; thus, the area of the semiconductor chip occupied by the test circuit is reduced.

BRIEF DESCRIPTION OF THE DRAWINGS

FIG. 10 is a table showing an example of the testing operations of the test circuit of the semiconductor device as provided in accordance with the present invention.
Reference numbers as employed in the drawings:
11, 12, 13, 60, 81 . . . Decoder circuit 14, 14', 15, 15', 16, 16', 17, 18, 61 . . . Latch circuit 19, 20, 21, 22, 23 . . . Delay circuit

DESCRIPTION OF THE PREFERRED EMBODIMENTS

Figure 1:
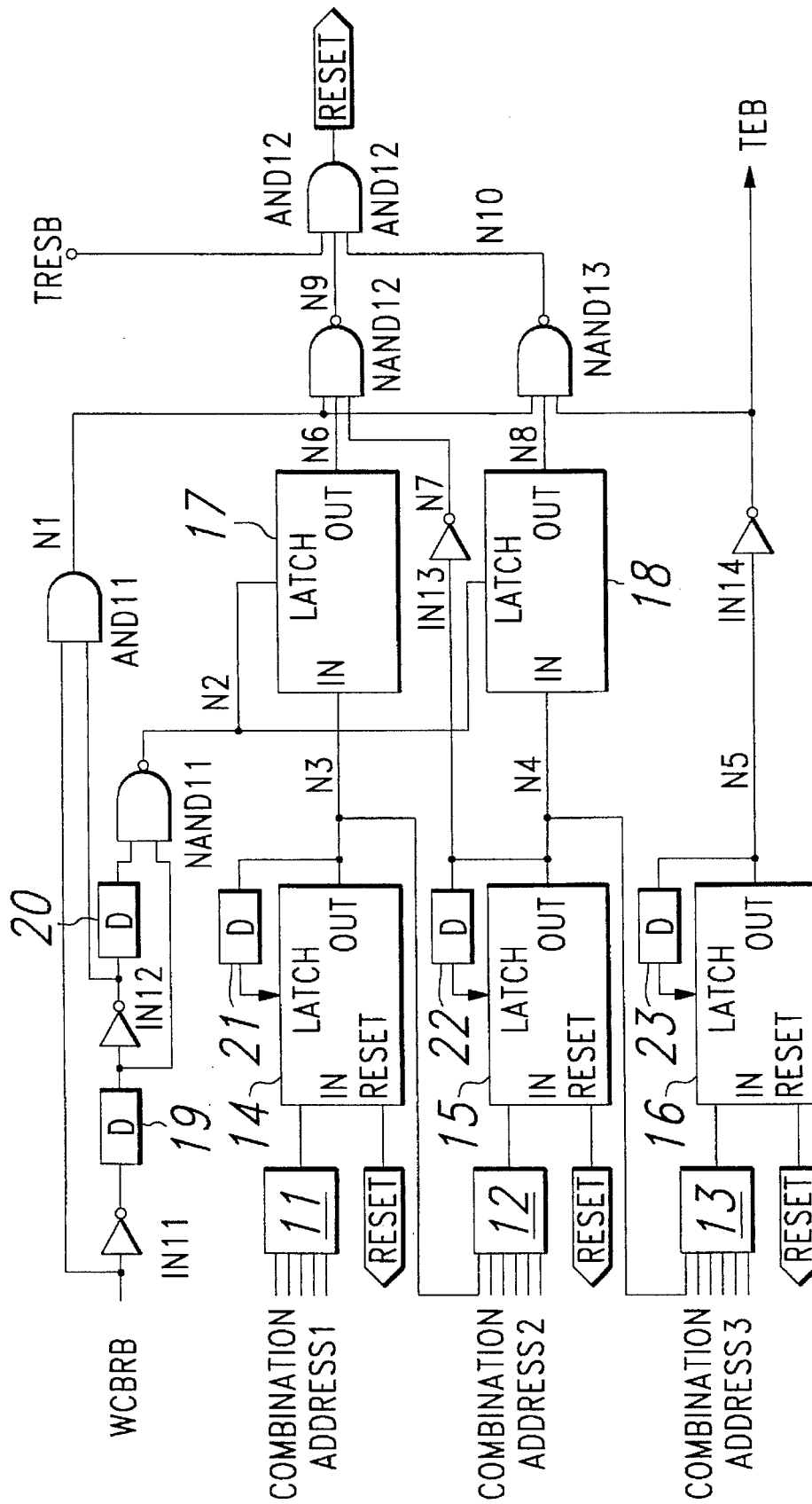
FIG. 1 is a schematic diagram of an embodiment of a test enable signal generating circuit in accordance with the present invention.

FIG. 1 shows an embodiment of a test enable signal generating circuit in accordance with the present invention as utilized in a semiconductor device, such as a dynamic random access memory (DRAM), for example. In FIG. 1, WCBRB is a signal indicating the detection of the WCBR cycle, which has a low level during the WCBR cycle and controls the timing of the setting of the test mode. TRESB is a signal indicating the RAS Only Refresh cycle or the CBR refresh cycle, and has a low level during the aforementioned cycles. CBR is the cycle wherein the column address strobe signal CAS goes low prior to the row-address strobe signal RAS. TEB is a test enable signal, and when this signal goes low, it becomes possible to enter each test mode.

Figure 2:
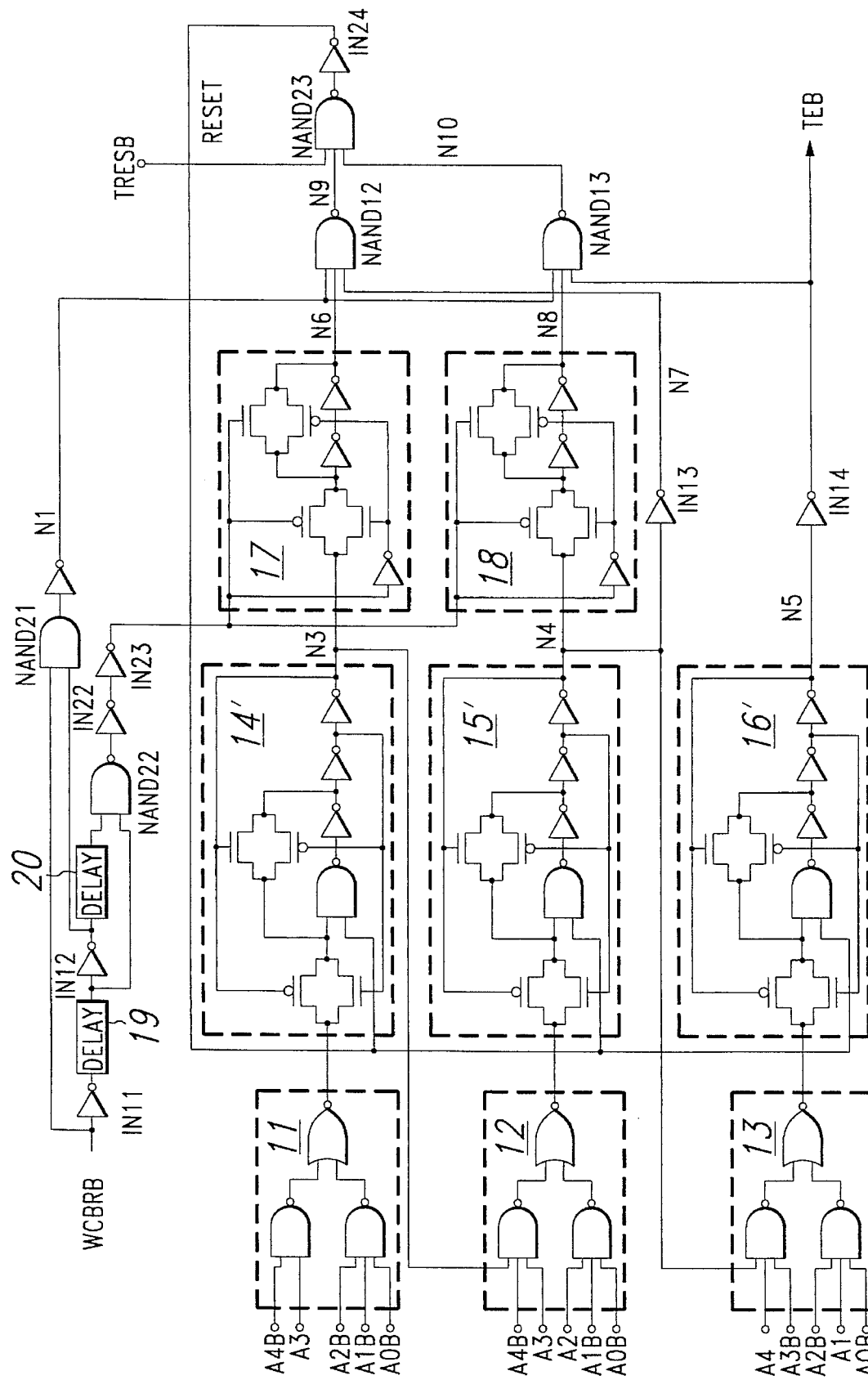
FIG. 2 is a detailed circuit diagram of the embodiment of FIG. 1.

FIG. 2 is a detailed circuit diagram of the embodiment shown in FIG. 1. In FIG. 2, elements which correspond to elements in FIG. 1 have identical reference numbers. Decoder circuits 11, 12, 13 are each composed of two NAND circuits and one NOR circuit. The combinations of latch circuit 14 with delay circuit 21, latch circuit 15 with delay circuit 22, and latch circuit 16 with delay circuit 23 are replaced respectively by the latch circuits 14', 15', 16' which are each constructed of one NAND circuit, three inverters, and two transfer gate pairs. The latch circuits 17 and 18 are constructed of three inverters and two transfer gate pairs, respectively. The components denoted by 19 and 20 are delay circuits, respectively. The operating timing of the circuits in FIG. 1 and FIG. 2 differ somewhat from each other.

Combination addresses 1, 2, 3 are each connected to the address bus, according to each address code that is set for each of them. For example, the combination address 1 is set as 08h in hexadecimal notation, the combination address 2 is set as 0Dh in hexadecimal notation, and the combination address 3 is set as 12h in hexadecimal notation. In this case, A0B, A1B, A2B, A3, A4B of the address line are input to the decoder circuit 11, A0, A1B, A2, A3, A4B of the address line are input to the decoder circuit 12, and, A0B, A1, A2B, A3B, A4 are input to the decoder circuit 13.

No specific meaning is attached to the address code itself of the combination address, but the reason for setting the combination addresses 2, 3 to be plus 5 as opposed to the combination address 1 is for simplifying the generation of the address signal by the tester during the actual test, and so that the other combination may be used for the values of the combination addresses.

Figure 3:
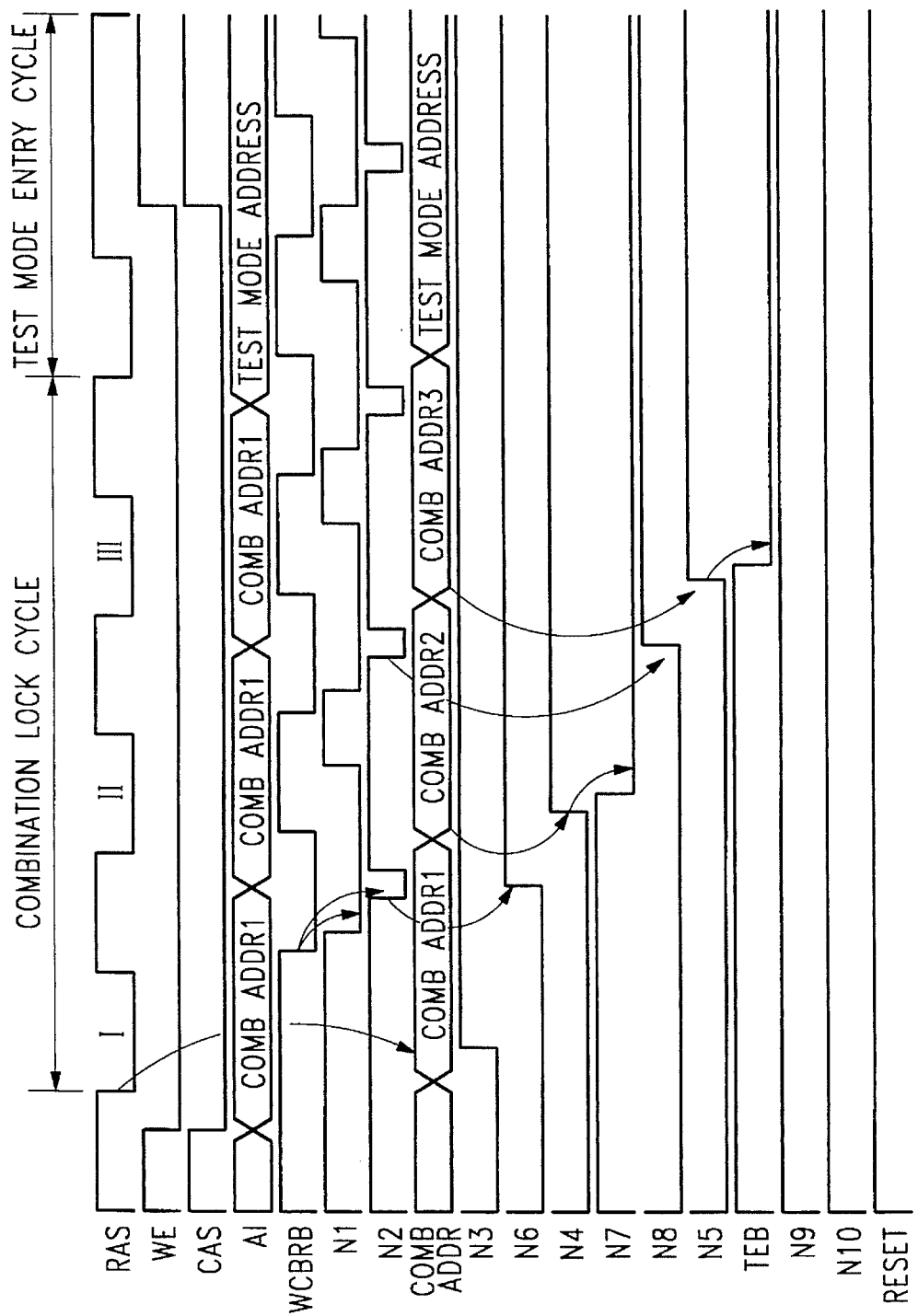
FIG. 3 is a timing chart of signals generated in the operation of the embodiment of FIG. 1.
Figure 4:
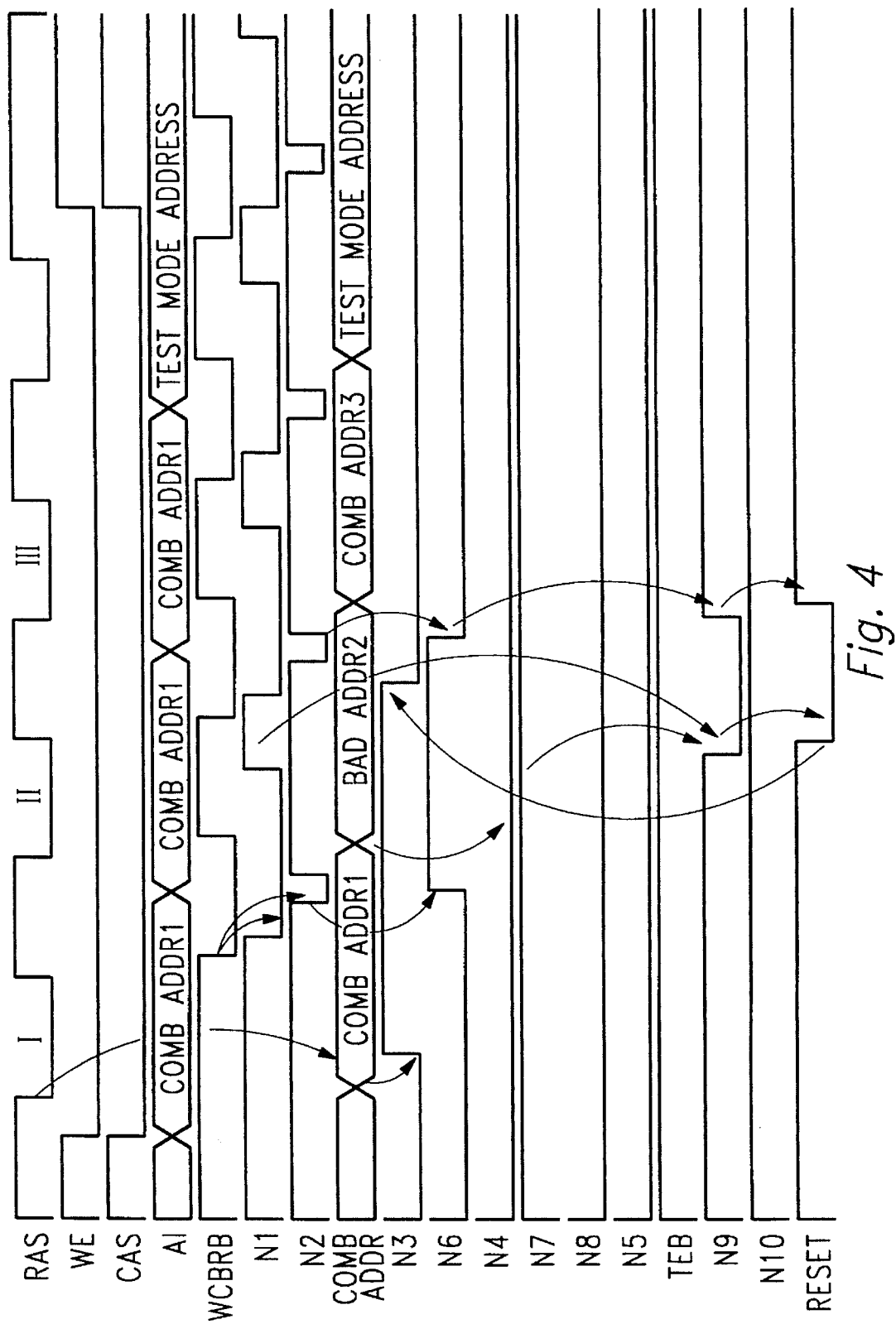
FIG. 4 is a timing chart of signals generated in the operation of the embodiment of FIG. 1.

FIG. 3 and FIG. 4 show the timing diagrams of the embodiment of FIG. 1. FIG. 3 shows the case when the test enable signal is enabled, and FIG. 4 shows the case when the test enable signal is disabled.

The case where the test enable signal is output will be explained with reference to FIG. 3.

In the first WCBR cycle (I in FIG. 3), the matching information of the combination address 1 (high level output of the decoder circuit 11) is read into the latch circuit 14 and latched. Next, with the rise of RAS, WCBRB goes low and a low level pulse is output to the node N2. Then, the output of the latch circuit 14 is read into the latch circuit 17 and latched by it.

The aforementioned operation is executed in the same manner also for the combination addresses 2 and 3, and TEB, that is, the test enable signal goes low. In the read operation of the combination addresses 2 and 3, when nodes N3 and N4 are high, that is, only when the combination address 1 or 2 is input in the previous WCBR cycle, the matching information of the combination addresses (high level outputs of decoder circuits 12 and 13) is latched by the latch circuit 15 or 16.

As described above, when the combination addresses 1, 2, 3 are input consecutively in synchronization with WCBR cycles, TEB goes low, and the entry into test mode becomes possible.

The description of the case when the combination address 2 has a wrong address code will be given below with reference to FIG. 4.

In the first WCBR cycle (I in FIG. 4), because the correct combination address 1 is read, the nodes N3 and N6 are high. In the second WCBR cycle (II in FIG. 4), in correct fashion, the combination address 2 with the correct address code (0Dh: hexadecimal notation) should be read and the node N4 must go high. However, in this case, if the combination address 2, that is, the address following the combination address 1, has the wrong value, the node N4 stays low. As a result, the node N7 remains high.

In this case, when the node N1 than has awaited the delay from the rise of WCBRB goes high, the node N9 goes low as a result. In such a case, the RESET goes low, and the latch circuits 11, 12, 13 are reset. Therefore, even if the combination address 3 with the correct value is input in the third WCBR cycle (III in FIG. 4), TEB stays at high, and entry into test mode is not executed.

Figure 5:
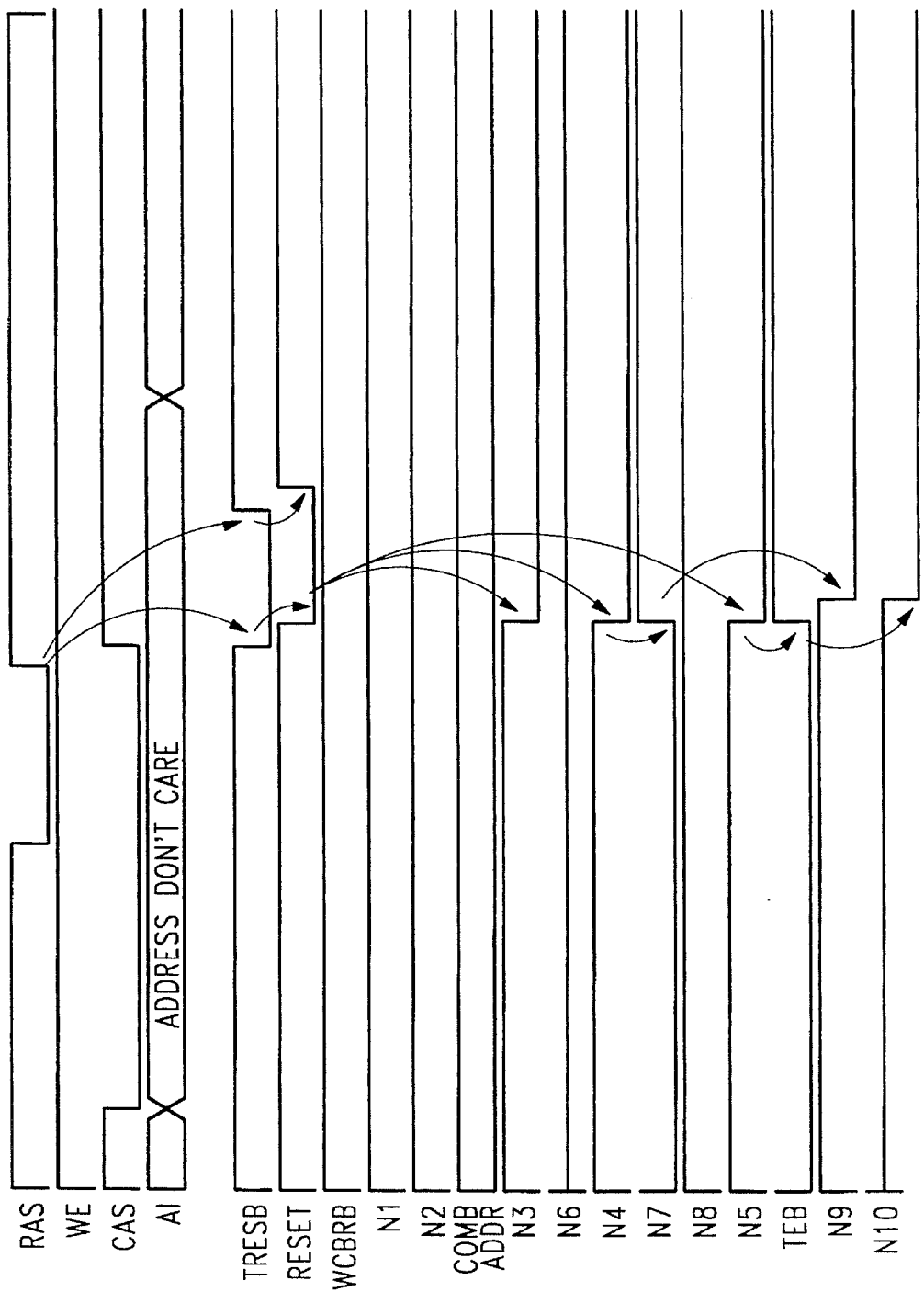
FIG. 5 is a timing chart of signals generated in the operation of the embodiment of FIG. 1.

FIG. 5 shows the timing diagram of the test mode cancellation by the CBR cycle. When TRESB that detects the CBR cycle goes low by the rise of RAS, RESET, which is the output signal of AND 12, goes low, and the latch circuits 14, 15, 16 are reset. TRESB goes low also when detecting the RAS only refresh, and just as in the case mentioned above, the latch circuits 14, 15, 16 are reset.

In FIG. 3, FIG. 4 and FIG. 5, AI is the address signal that is input to the address terminal of the DRAM.

As has been described above, according to the present invention, because the test mode can be set without applying a voltage higher than the power supply voltage to the external terminal of a semiconductor device, such as a DRAM, an internal transistor of the semiconductor device will not be degraded by high voltage. Also, during the burn-in test of the semiconductor device, the erroneous setting test mode can be avoided.

Figure 6:
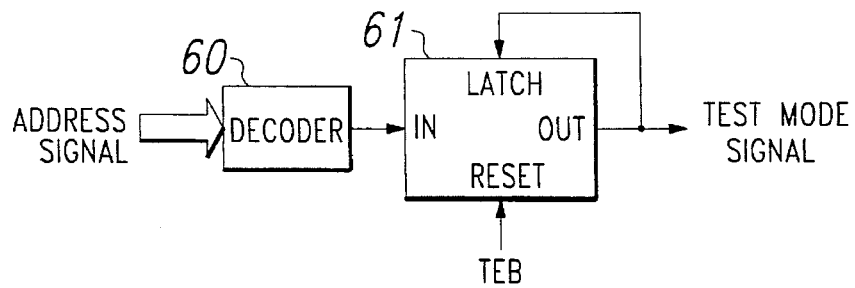
FIG. 6 is a schematic diagram of an embodiment of a test mode entry circuit in accordance with the present invention.
Figure 8:
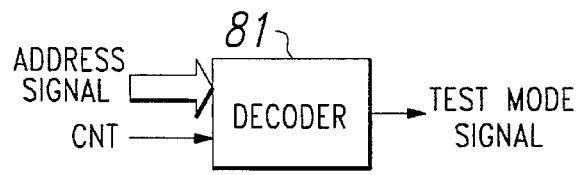
FIG. 8 is a schematic diagram of a conventional test mode entry circuit.
Figure 9:
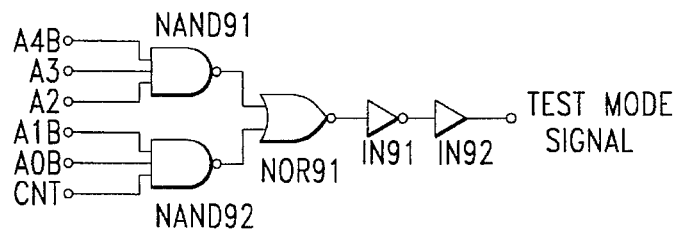
FIG. 9 ms a detailed circuit diagram of the conventional test mode entry circuit shown in FIG. 8.

FIG. 6 shows an embodiment of the test mode entry circuit according to the present invention. This test mode entry circuit is made up of a decoder circuit 60 to decode the address that indicates the test mode, and a latch circuit 61 to latch the output of the decoder circuit 60, that is the result of the decoding. The difference from the conventional test mode entry circuit shown in FIG. 8 lies in that the latch circuit 61 is provided in the embodiment of FIG. 6.

Figure 7:
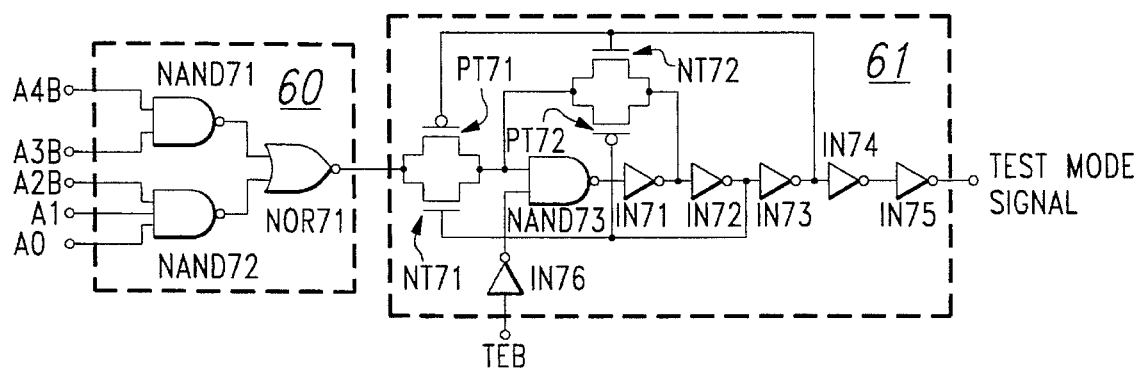
FIG. 7 is a detailed circuit diagram of the embodiment of the test mode entry circuit of FIG. 6.

FIG. 7 shows details of the circuits of the test mode entry circuit in FIG. 6. The decoder circuit 60 is composed of NAND circuits NAND 71, 72, and a NOR circuit, NOR 71. The latch circuit 61 is composed of a NAND circuit, NAND 73, inverters IN 71, 72, 73, 74, 75, 76, p-channel MOS transistors PT 71, 72, and n-channel MOS transistors, NT 71, 72.

The decoder circuit 60 is connected to the address bus, and, when the address set for the decoder circuit 60 is input, it outputs a high level signal to the latch circuit 61. When TEB is low, the latch circuit 61 latches the high level signal output from the decoder circuit 60.

In FIG. 7, A0, A1, A2B, A3B, A4B of the address signal are input to the decoder circuit 60. Accordingly, in this decoder circuit 60, 03h in hexadecimal notation is set, and when the address corresponding to that address code is input, it outputs a high level signal.

This latch circuit 61 is reset only by TEB. For this TEB, the test enable signal, TEB, that is output from the test enable signal generating circuit shown in FIG. 1 may be used.

Consequently, once the test mode entry circuit latches the high level test mode signal, even if the address with a value other than the address code specified in the decoder circuit 60 is input and the output of the decoder circuit 60 is thereby caused to go low, the latch circuit 61 continues to output a high level signal.

In this test mode entry circuit, the test functions obtained by subdividing the conventional test modes into smaller functional units are assigned to it as the address codes set in the decoder circuit 60, and, through the selection of a combination of the number of test mode entry circuits, the respective test modes are implemented.

For example, in the conventional word line stress test, the test is activated by the input of a specified address code, and in that case, the conditions for association are set together with it; for example, the bit line is set to Vss (ground potential) and the plate electrode is set to Vss. On the other hand, in the semiconductor device test circuit according to the present invention, the functions, such as setting the bit line to Vss and the plate electrode to Vss, are provided as independent test modes; then, by combining a number of these test modes, various types of tests are executed.

In the case of the word line test mentioned above, three test modes, that is, a multiword test, setting the bit line to Vss, and setting the plate electrode to Vss, are set in a repetitive form. Also, if the refresh cycle is executed during the bit line Vss test, the data "0" can be written to all memory cells. Moreover, if the bit line Vdd (power supply potential) and plate Vdd test are prepared, a stress test with various conditions can be implemented. In this case, it is possible to write the data "1" to all memory cells.

Therefore, various types of test modes can be implemented by inputting a small number of addresses. This will contribute to a reduction in the area of the semiconductor chip occupied by the test circuit.

In the test mode entry circuit of the present invention, since the test mode is maintained until the test enable signal TEB is disabled, by establishing a number of test mode entry circuits consecutively, tests which have been considered impossible to implement by conventional means can be implemented.

FIG. 10 shows an example of testing operations for the semiconductor device test circuit of the present invention. In this test, entry into test mode is executed by using the test enable signal generating circuit shown in FIG. 1 and the test mode entry circuit shown in FIG. 6, and the actual testing operation is performed by a circuit not shown in the figure. For the circuit for performing this testing operation, a conventionally used circuit may be applied.

First, by operations A, B, C, the test enable signal TEB goes low, and the test mode is implemented. These operations are effected by the operations explained in conjunction with FIGS. 1 and 3. Because the test enable signal TEB has gone low, when the predetermined address in the test mode entry circuit shown in FIG. 6 is input, the test corresponding to that address is entered.

In operation D, when the address "00011" is input, the test mode entry circuit that is set to this address responds, and the test mode signal indicating the entry of the 32-bit parallel test becomes high. As a result, by responding to this high level test mode signal, the 32-bit parallel test circuit is activated, thereby executing the 32-bit parallel test. Thereafter, when the addresses E, F, G, H, I, J which indicate the test functions are input consecutively in accordance with WCBR cycles, as shown in FIG. 10, various types of tests are executed one after the other.

Next, when, in operation K, the RAS only refresh, etc., is executed, TRESB in FIG. 1 goes low, and the test enable signal TEB goes high. As a result, the test mode signal of the test mode entry circuit shown in FIG. 6 goes low, resulting in the cancellation of the test mode. Thereafter, even if an address that is set in the test mode entry circuit is input and the output of the decoder circuit 60 goes high, the test mode is not entered because TEB is high.

As has been described above, according to the testing operations of the semiconductor device test circuit of the present invention, the tests can be executed consecutively without exiting the test mode. Accordingly, by subdividing the elements of the test into individual test functions and entering those test functions sequentially, various types of tests can be implemented. Also, since the test is conducted through combining a number of test functions, the number of addresses assigned to the test mode may be reduced, and, in turn, the number of the test mode entry circuits can be reduced.

In the example shown in FIG. 10, at least seven of the test mode entry circuits shown in FIG. 6 are necessary.

A description of the semiconductor device test circuits according to the present invention has been given with reference to the described embodiments. However, the present invention is not limited to the above-mentioned embodiments, and various modifications are conceivable. In the test enable signal generating circuit shown in FIG. 1, three combinations of addresses for the generation of the test enable signal are used, but the number of such combinations may be two or four or more. With an increase in the number of address combinations, the probability of an erroneous output of the test enable signal is less.

Also, the structure of the decoder circuit and the latch circuit included in the described embodiments are not limited to those described above, and conventionally known circuits may be used for the implementation of the invention insofar as they satisfy the functions of the invention. Furthermore, the number of the address bits to be input to the decoder circuit may be changed.

Also, as to the consecutive test operations shown in FIG. 10, the order of operations, the type of test, and the number of tests may also be changed.

As should be apparent from the description given above, according to the present invention, a test mode is not entered during normal use of a semiconductor device. In addition, a test mode may be entered without applying a voltage higher than the supply voltage to an external terminal of the semiconductor device to be tested, and an internal transistor of the semiconductor device is not damaged by entering the test mode.

Also, since the number of addresses for defining the test can be reduced, the corresponding area of the semiconductor chip allocated to the test circuit is less.

Moreover, by subdividing respective elements of the test into individual test functions and then entering, in complex fashion, those subdivided groups of the test functions, complicated tests can be implemented. Therefore, the number of the types of tests can be increased without increasing the area of the semiconductor chip occupied by the test circuit. Moreover, a number of test modes can be entered simultaneously.

We claim:

1. A semiconductor device comprising:

a semiconductor substrate;

an electronic circuit provided in and/or on said semiconductor substrate and having at least one electronic function to be performed when the electronic circuit is activated;

a test circuit provided in and/or on said semiconductor substrate in proximity to said electronic circuit, said test circuit being operably connected to said electronic circuit and having at least one test procedure to be performed with respect to said at least one electronic function of the electronic circuit for establishing proper execution thereof during activation of said electronic circuit, said test circuit including a test enable circuit for receiving a plurality of address signals as inputs thereto in a predetermined operating cycle; and said test enable circuit being responsive to the receipt thereof of a predetermined combination of the plurality of address signals within the predetermined operating cycle for providing a test enable signal as an output enabling the performance of said at least one test procedure on said electronic circuit.

2. A semiconductor device as set forth in claim 1, wherein said test circuit includes at least one test mode entry circuit, said test mode entry circuit including a decoder circuit having an input for receiving an address signal and an output for providing a matching address-test mode signal as an output dependent upon the address signal as received by the input thereof being indicative of a particular test mode, a latch circuit having first, second, and third inputs and an output, the first input of said latch circuit being connected to the output of said test enable circuit for receiving said test enable signal therefrom when generated and resetting said latch circuit, the second input of said latch circuit being connected to the output of said decoder circuit for receiving the matching address-test mode signal as output from said decoder circuit, a feedback line extending from the output of said latch circuit to the third input thereof;

said matching address-test mode signal being latched by said latch circuit upon condition that said test enable signal has been received by the latch circuit via the first input thereof and being continuously provided as an output by said latch circuit regardless of the subsequent receipt by the input of said decoder circuit of an address signal which is not indicative of said particular test mode.

3. A semiconductor device as set forth in claim 2, wherein a plurality of test mode entry circuits are included in said test circuit, each of said test mode entry circuits having a decoder circuit and a latch circuit;

said plurality of test mode entry circuits being selectively combinable in various different combinations of test mode entry circuits wherein the respective combinations of test mode entry circuits include at least some of the test mode entry circuits of said plurality of test mode entry circuits; and the test mode entry circuits in a selected combination being respectively activated in response to a corresponding matching address-test mode signal being latched by the latch circuit of a particular test mode entry circuit upon condition that said test enable signal has been received by the latch circuit and being continuously provided as an output by the latch circuit such that a test procedure as performed on the electronic circuit is defined by a specific selected combination of consecutively activated test mode entry circuits.

4. A semiconductor device comprising:

a semiconductor substrate;

an electronic circuit provided in and/or on said semiconductor substrate and having a plurality of electronic functions to be performed when the electronic circuit is activated;

a test circuit provided in and/or on said semiconductor substrate in proximity to said electronic circuit, said test circuit being operably connected to said electronic circuit and having a plurality of test procedures to be performed with respect to said plurality of electronic functions of the electronic circuit for establishing proper execution thereof during activation of said electronic circuit, said test circuit including a plurality of test mode entry circuits;

each of said test mode entry circuits including
- a decoder circuit having an input for receiving an address signal and an output for providing a matching address-test mode signal as an output dependent upon the address signal as received by the input thereof being indicative of a particular test mode,
- a latch circuit having first, second, and third inputs and an output,
- the first input of said latch circuit being connected in said test circuit for receiving a test enable signal when generated and resetting said latch circuit,
- the second input of said latch circuit being connected to the output of said decoder circuit for receiving the matching address-test mode signal as output from said decoder circuit, and
- a feedback line extending from the output of said latch circuit to the third input thereof;

said matching address-test mode signal being latched by said latch circuit upon condition that said test enable signal has been received by the latch circuit via the first input thereof and being continuously provided as an output by said latch circuit regardless of the subsequent receipt by the input of said decoder circuit of an address signal which is not indicative of said particular test mode; and said plurality of test mode entry circuits being combinable in a plurality of different combinations of said plurality of test mode entry circuits for providing a composite test procedure including a plurality of test procedures identified by the corresponding test mode entry circuits included in a selected combination thereof for activating the respective test procedures included in the composite test procedure to be performed with respect to the plurality of electronic functions of the electronic circuit for establishing proper execution thereof during activation of said electronic circuit.

5. A method of testing an electronic circuit of a semiconductor device having at least one electronic function to be performed when the electronic circuit is activated and being provided in and/or on a semiconductor substrate having a test circuit in and/or on the semiconductor substrate in proximity to the electronic circuit and operably connected thereto, said testing method comprising:

generating a plurality of address signals within the electronic circuit;

inputting the plurality of address signals to the test circuit within a predetermined operating cycle;

providing a test enable signal from the test circuit as an output upon the condition that the plurality of address signals received thereby within the predetermined operating cycle occur in a specific predetermined combination; and performing at least one test procedure on said electronic circuit dependent upon the occurrence of said test enable signal as an output from the test circuit.

6. A method of testing an electronic circuit of a semiconductor device as set forth in claim 3, wherein the method further includes defining a plurality of test procedures comprising a composite test procedure and corresponding to a plurality of electronic functions to be performed by the electronic circuit when the electronic circuit is activated;

selecting from a plurality of test mode entry circuits included in the test circuit a combination of test mode entry circuits corresponding to the plurality of test procedures comprising the composite test procedure;

activating the test mode entry circuits included in the selected combination of test mode entry circuits; and performing the test procedures corresponding to the respective ones of the test mode entry circuits included in the selected combination of test mode entry circuits on said electronic circuit to complete the composite test procedure in response to the activation of said test mode entry circuits included in the selected combination thereof.

7. A method of testing an electronic circuit of a semiconductor device having a plurality of electronic functions to be performed by the electronic circuit when the electronic circuit is activated and being provided in and/or on a semiconductor substrate having a test circuit in and/or on the semiconductor substrate in proximity to the electronic circuit and operably connected thereto, said testing method comprising:

defining a plurality of test procedures comprising a composite test procedure and corresponding to the plurality of electronic functions to be performed by the electronic circuit when the electronic circuit is activated;

selecting from a plurality of test mode entry circuits included in the test circuit a combination of test mode entry circuits corresponding to the plurality of test procedures comprising the composite test procedure;

activating the test mode entry circuits included in the selected combination of test mode entry circuits; and performing the test procedures corresponding to the respective ones of the test mode entry circuits included in the selected combination of test mode entry circuits on said electronic circuit to complete the composite test procedure in response to the activation of said test mode entry circuits included in the selected combination thereof.

* * * * *